United States Patent
Tagami et al.

(10) Patent No.: US 10,854,496 B2
(45) Date of Patent: Dec. 1, 2020

(54) CIRCUIT SUBSTRATE PROCESSING LAMINATE AND METHOD FOR PROCESSING CIRCUIT SUBSTRATE

(71) Applicant: SHIN-ETSU CHEMICAL CO., LTD., Tokyo (JP)

(72) Inventors: Shohei Tagami, Annaka (JP); Michihiro Sugo, Takasaki (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 16/366,637

(22) Filed: Mar. 27, 2019

(65) Prior Publication Data

US 2019/0318952 A1 Oct. 17, 2019

(30) Foreign Application Priority Data

Apr. 16, 2018 (JP) ................................. 2018-78234

(51) Int. Cl.
*H01L 21/683* (2006.01)
*H01L 21/304* (2006.01)
*H01L 21/67* (2006.01)

(52) U.S. Cl.
CPC ........ *H01L 21/6836* (2013.01); *H01L 21/304* (2013.01); *H01L 21/67132* (2013.01); *H01L 2221/68327* (2013.01)

(58) Field of Classification Search
CPC ........................................... H01L 2221/68318
USPC ...................................................... 428/195.1
See application file for complete search history.

(56) References Cited

U.S. PATENT DOCUMENTS

| 7,541,264 B2 | 6/2009 | Gardner et al. |
| 2005/0233547 A1 | 10/2005 | Noda et al. |
| 2015/0299527 A1* | 10/2015 | Hashima ................ C09J 123/02 524/528 |
| 2017/0053821 A1* | 2/2017 | Sugo .......................... C09J 7/35 |

(Continued)

FOREIGN PATENT DOCUMENTS

| EP | 3121838 A1 | 1/2017 |
| EP | 3159924 A1 | 4/2017 |

(Continued)

OTHER PUBLICATIONS

Sep. 19, 2019 Extended Search Report issued in European Patent Application No. 19168048.7.

*Primary Examiner* — Ian A Rummel
(74) *Attorney, Agent, or Firm* — Oliff PLC

(57) ABSTRACT

A circuit substrate processing laminate has, sequentially in the order of a support, a temporary adhesive material layer releasably laminated on the support, and a circuit substrate. The circuit substrate has a front surface on which a circuit is formed and a back surface to be processed. The temporary adhesive material layer is releasably laminated to the front surface, and is composed of a thermosetting siloxane polymer layer laminated on the support, after cured, has a first peeling force of 10 to 500 mN/25 mm as measured by a 180° peel test. The first peeling force is required for peeling the polymer layer from an interface with the support. The polymer layer, after cured, has a second peeling force of 50 to 1000 mN/25 mm as measured by the 180° peel test. The second peeling force is required for peeling the polymer layer from an interface with the circuit substrate.

16 Claims, 1 Drawing Sheet

(56) References Cited

U.S. PATENT DOCUMENTS

2017/0069521 A1   3/2017   Sugo et al.
2017/0110360 A1   4/2017   Tagami et al.

FOREIGN PATENT DOCUMENTS

JP   2004-064040 A   2/2004
JP   2006-328104 A   12/2006

* cited by examiner

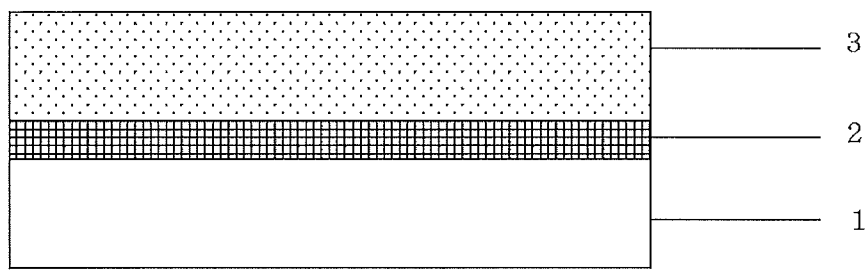

CIRCUIT SUBSTRATE PROCESSING LAMINATE AND METHOD FOR PROCESSING CIRCUIT SUBSTRATE

TECHNICAL FIELD

The present invention relates to a circuit substrate processing laminate and a method for processing a circuit substrate. Particularly, the present invention relates to a circuit substrate processing laminate and a method for processing a circuit substrate which enable a thin circuit substrate to be obtained effectively.

BACKGROUND ART

Three-dimensional semiconductor mounting has become essential for higher density and larger capacity. The three-dimensional mounting technique is a semiconductor production technique for thinning a semiconductor chip and connecting the chip to another chip by a through silicon via (TSV) electrode to form a multilayer. To realize this technique, steps of grinding a non-circuit-forming surface (also referred to as "back surface") of a substrate on which a semiconductor circuit has been formed to thin the substrate, and then forming an electrode including a TSV on the back surface, are required. In the step of grinding the back surface of a silicon substrate, a protective tape for the back surface is conventionally attached to a surface opposite to the surface to be ground to prevent the wafer from breaking during grinding. However, this tape uses an organic resin film as the base material, which has flexibility but inadequate strength and heat resistance. Thus, this tape is not suited to the steps of forming a TSV and forming a wiring layer on the back surface.

In this context, there has been proposed a system in which a semiconductor substrate is bonded to a support made of silicon, glass, or the like, through an adhesive layer to sufficiently withstand the steps of grinding the back surface and forming a TSV and an electrode on the back surface. In this system, the adhesive layer used for bonding the substrate to the support is important. The adhesive layer requires a sufficient durability to bond the substrate and the support without gaps and to withstand subsequent steps, and also requires an ability to easily detach a thin wafer from the support finally. The adhesive layer, which is finally removed, is hence referred herein to as "temporary adhesive layer" (or temporary adhesive material layer).

With respect to the conventionally known temporary adhesive layer and a method for removing this layer, the following techniques have been proposed: an adhesive material containing a light-absorbing substance is irradiated with high intensity light to decompose the adhesive material layer, whereby the adhesive material layer is removed from the support (Patent Document 1); and a heat fusible hydrocarbon compound is used for the adhesive material, and bonding and removal are carried out in a heat-molten state (Patent Document 2). The former technique has problems of requiring expensive tools such as laser, and a long treatment time per substrate. The latter technique is simple because of control only by heat, but thermal stability is insufficient at a high temperature exceeding 200° C., and thus the applicable range is limited. Furthermore, these temporary adhesive layers are not adequate to form a film with uniform thickness on a heavily stepped substrate and to provide a complete adhesion to the support.

Besides, there has been proposed a technique related to a wafer processing method in which a silicone adhesive is used for the temporary adhesive material layer (Patent Document 3). In this method, a substrate is bonded to a support with an addition-curable silicone adhesive, and on the removal, the assembly is immersed in a chemical solution capable of dissolving or decomposing the silicone resin to separate the substrate from the support. Thus, this method requires a very long time for separation and is difficultly applied to the actual producing process.

CITATION LIST

Patent Literature

Patent Document 1: Japanese Patent Laid-Open Publication No. 2004-64040
Patent Document 2: Japanese Patent Laid-Open Publication No. 2006-328104
Patent Document 3: U.S. Pat. No. 7,541,264

SUMMARY OF INVENTION

Technical Problem

The present invention was accomplished in view of the above-described problems, and has an object to provide a circuit substrate processing laminate and a method for processing a circuit substrate which: enable construction of simple and inexpensive process, are highly compatible with steps of forming a TSV and forming a wiring on the substrate back surface, have excellent resistance to a thermal process such as CVD, prevent the circuit substrate from slipping at the time of grinding the circuit substrate and so forth, facilitate separation of the support or the circuit substrate, allow the thermosetting siloxane polymer layer (A) to separate from the circuit substrate with no residue, and can increase productivity of thin substrates.

Solution to Problem

To achieve the object, the present invention provides a circuit substrate processing laminate comprising, sequentially in the order of a support, a temporary adhesive material layer, and a circuit substrate, wherein the temporary adhesive material layer is releasably laminated on the support, the circuit substrate has a front surface on which a circuit is formed and a back surface to be processed, and the temporary adhesive material layer is releasably laminated to the front surface of the circuit substrate, the temporary adhesive material layer is composed of a thermosetting siloxane polymer layer (A), the polymer layer (A) laminated on the support, after cured, has a first peeling force of 10 to 500 mN/25 mm as measured by a 180° peel test conducted at 5 mm/second using a test piece having a width of 25 mm, where the first peeling force is required for peeling the polymer layer (A) from an interface with the support, and the polymer layer (A) laminated on the circuit substrate, after cured, has a second peeling force of 50 to 1000 mN/25 mm as measured by the 180° peel test conducted at 5 mm/second using a test piece having a width of 25 mm, where the second peeling force is required for peeling the polymer layer (A) from an interface with the circuit substrate.

Such a circuit substrate processing laminate as above includes the temporary adhesive material layer having a monolayer structure composed of the thermosetting siloxane polymer layer (A). This temporary adhesive material layer easily accomplishes the temporary adhesion between the circuit substrate and the support, and the temporary adhesive material layer is formed to have a uniform thickness even when a heavily stepped substrate is used. Moreover, such a circuit substrate processing laminate is highly compatible with steps of forming a TSV and forming a wiring on the wafer back surface, enables construction of simple and inexpensive process by forming a single layer of the temporary adhesive layer, further has favorable resistance to a thermal process such as CVD, allows easy separation even if a thin wafer is diced before separation, and can increase productivity of thin wafers. Further, since the inventive thermosetting siloxane polymer layer (A) has the peeling forces after thermally cured, the circuit substrate is prevented from slipping at the time of grinding the back surface of the circuit substrate and so forth, and the thermosetting siloxane polymer layer (A) is not separated even when exposed to high temperature. The thermosetting siloxane polymer layer (A) facilitates separation of the support or the circuit substrate, and can be separated from the circuit substrate with no residue.

In this case, the thermosetting siloxane polymer layer (A) is preferably a cured product of a composition containing (A-1) an organopolysiloxane having two or more alkenyl groups per molecule, (A-2) an organohydrogenpolysiloxane having two or more silicon atom-bonded hydrogen atoms (Si—H groups) per molecule, and (A-3) a platinum-based catalyst, in such an amount that a mole ratio of the Si—H groups in the component (A-2) to the alkenyl groups in the component (A-1) is 0.3 to 10.

An example of the composition before thermal curing for forming the thermosetting siloxane polymer layer (A) having the above-described peeling forces includes such a composition containing (A-1) to (A-3).

Additionally, the organopolysiloxane (A-1) having two or more alkenyl groups per molecule preferably contains a siloxane unit (Q unit) represented by $SiO_{4/2}$.

The cured product of the composition containing such (A-1) is preferable because the cured product surely has the peeling forces.

Moreover, the thermosetting siloxane polymer layer (A) is preferably a cured product of a composition containing the component (A-1), the component (A-2), the component (A-3), and further either or both of (A-4) an organic solvent and (A-5) a reaction retarder.

When the composition before curing for forming the thermosetting siloxane polymer layer (A) contains the organic solvent (A-4), it is possible to adjust the viscosity of the composition and prepare a solution so as to obtain a targeted film thickness. Moreover, adding the reaction retarder (A-5) can increase the stability during storage.

Further, the cured product of the thermosetting siloxane polymer layer (A) preferably contains 0.001 to 60.000 mol % of a siloxane unit (M unit) represented by $R^1R^2R^3SiO_{1/2}$, 10.000 to 99.999 mol % of a siloxane unit (D unit) represented by $R^4R^6SiO_2/2$, 0.000 to 0.005 mol % of a siloxane unit (T unit) represented by $R^6SiO_{3/2}$, and 0.000 to 60.000 mol % of a siloxane unit (Q unit) represented by $SiO_{4/2}$, where $R^1$ to $R^6$ each represent an unsubstituted or substituted monovalent hydrocarbon group.

When the cured thermosetting siloxane polymer layer (A) is such a layer (film), a desirable elastic modulus can be satisfied.

In this case, the cured product of the thermosetting siloxane polymer layer (A) preferably has a storage elastic modulus at 25° C. of $1\times10^6$ to $1\times10^9$ Pa.

The cured thermosetting siloxane polymer layer (A) is preferably a layer (film) having such a elastic modulus because the film can sufficiently withstand the grinding step for thinning the circuit substrate, and reducing the warpage of the substrate prevents such a problem of the substrate being caught by an apparatus during the process.

The present invention also provides a method for processing a circuit substrate, comprising the steps of:
(a) preparing the above-described circuit substrate processing laminate;
(b) thermally curing the thermosetting siloxane polymer layer (A);
(c) grinding or polishing the back surface of the circuit substrate;
(d) processing the back surface of the circuit substrate;
(e) separating the support from the circuit substrate processing laminate; and
(f) taking out only the circuit substrate by separating a cured film of the polymer layer (A) from the circuit substrate processing laminate from which the support has been separated.

Moreover, the present invention provides a method for processing a circuit substrate, comprising the steps of:
(a) preparing the above-described circuit substrate processing laminate;
(b) thermally curing the thermosetting siloxane polymer layer (A);
(c) grinding or polishing the back surface of the circuit substrate;
(d) processing the back surface of the circuit substrate; and
(g) taking out only the circuit substrate by separating the support and the polymer layer (A) together from the circuit substrate processing laminate.

In such methods for processing a circuit substrate, the inventive monolayer temporary adhesive material layer is used to bond the circuit substrate and the support. The use of this temporary adhesive material layer allows easy production of a thin wafer (thin circuit substrate) having a through electrode structure or a bump connection structure. Moreover, the separating step allows the support to be easily separated from the processed circuit substrate.

In this case, the step (a) of preparing the circuit substrate processing laminate preferably includes:
(a-1) a step of laminating an uncured composition layer of the thermosetting siloxane polymer layer (A) onto the support; and
(a-2) a step of bonding the support and the circuit substrate with the uncured composition layer of the polymer layer (A) interposed therebetween.

Meanwhile, in this case, the step (a) of preparing the circuit substrate processing laminate preferably includes:
(a-3) a step of laminating an uncured composition layer of the polymer layer (A) onto the circuit substrate; and
(a-4) a step of bonding the circuit substrate and the support with the uncured composition layer of the polymer layer (A) interposed therebetween.

The step (a) of preparing the circuit substrate processing laminate includes these methods.

Advantageous Effects of Invention

The temporary adhesive material layer in the inventive circuit substrate processing laminate has a monolayer structure, so that it is only necessary to treat the monolayer. This enables construction of simple and inexpensive process. Since the thermosetting siloxane polymer layer is used as the temporary adhesive layer, the resin does not thermally decompose, does not flow at high temperature, and has high heat resistance. Thus, the temporary adhesive material layer is applicable to a wide range of the semiconductor film-forming process, and can form an adhesive material layer with high film-thickness uniformity even on a stepped wafer. This film-thickness uniformity makes it possible to easily obtain a uniform thin circuit substrate 50 μm or less thick. Furthermore, after the thin circuit substrate is manufactured, the temporary adhesive material layer can be easily separated from the support at room temperature, so that a breakable thin circuit substrate can be easily manufactured.

BRIEF DESCRIPTION OF DRAWING

FIG. 1 is a cross-sectional view showing an example of a circuit substrate processing laminate of the present invention.

DESCRIPTION OF EMBODIMENTS

Hereinafter, the present invention will be described in more details.

The present inventors have earnestly studied to achieve the above object and consequently found a circuit substrate processing laminate and a method for processing a circuit substrate which enable easy production of a thin circuit substrate having a through electrode structure or a bump connection structure when the circuit substrate processing laminate uses a monolayered thermosetting temporary adhesive layer which is composed of a thermosetting siloxane polymer layer (A) having particular peeling forces after curing.

As shown in FIG. 1, a circuit substrate processing laminate 10 of the present invention is a circuit substrate processing laminate including, sequentially in the following order: a support 1, a temporary adhesive material layer 2, and a circuit substrate 3. The temporary adhesive material layer 2 is releasably laminated on the support 1. The circuit substrate 3 has a front surface on which a circuit is formed and a back surface to be processed. The temporary adhesive material layer 2 is releasably laminated to the front surface of the circuit substrate 3. More specifically, the temporary adhesive material layer 2 is placed between the circuit substrate 3, which has the front surface as a circuit surface and the back surface to be processed, and the support 1, which supports the circuit substrate 3 when the circuit substrate 3 is processed. In the present invention, the temporary adhesive material layer 2 is composed of a thermosetting siloxane polymer layer (A).
<Temporary Adhesive Material Layer>
—Thermosetting Siloxane Polymer Layer (A)—

The thermosetting siloxane polymer layer (A) is a constitutional element of the inventive circuit substrate processing laminate. The thermosetting siloxane polymer layer (A), after cured (i.e., after the polymer layer (A) laminated on the support is cured), has a first peeling force of 10 to 500 mN/25 mm, preferably 30 to 500 mN/25 mm, more preferably 50 to 200 mN/25 mm, as measured by a 180° peel test in which a test piece having a width of 25 mm is pulled off at 5 mm/second. The first peeling force is required for peeling the polymer layer (A) from an interface with the support. After thermally cured, the inventive thermosetting siloxane polymer layer (A) has the first peeling force of 10 mN or more for the peeling from the interface with the support and thus is not separated, for example, during a step of processing the back surface of the circuit substrate. Meanwhile, since the first peeling force is 500 mN or less, the cured film of the polymer layer (A) can be easily separated from the support.

Further, in the present invention, the polymer layer (A) laminated on the circuit substrate, after cured (i.e., after the polymer layer (A) laminated on the circuit substrate is cured), has a second peeling force of 50 to 1000 mN/25 mm, preferably 70 to 1000 mN/25 mm, more preferably 80 to 500 mN/25 mm, as measured by the 180° peel test in which a test piece having a width of 25 mm is pulled off at 5 mm/second. The second peeling force is required for peeling the polymer layer (A) from an interface with the circuit substrate. After thermally cured, the inventive thermosetting siloxane polymer layer (A) has the second peeling force of 50 mN or more for the peeling from the interface with the circuit substrate and thus is not separated, for example, during the step of processing the back surface of the circuit substrate, and is not separated particularly during the high temperature process, either. Meanwhile, since the second peeling force is 1000 mN or less, the cured film of the polymer layer (A) can be separated from the circuit substrate by using a tape.

An example of a composition before thermal curing for forming the thermosetting siloxane polymer layer (A) having such peeling forces include a composition containing:

(A-1) an organopolysiloxane having two or more alkenyl groups per molecule;

(A-2) an organohydrogenpolysiloxane having two or more silicon atom-bonded hydrogen atoms (Si—H groups) per molecule, in such an amount that a mole ratio of the Si—H groups in the component (A-2) to the alkenyl groups in the component (A-1) is 0.3 to 10; and (A-3) a platinum-based catalyst.

Additionally, as optional components, either or both of (A-4) an organic solvent and (A-5) a reaction retarder may be incorporated. In such a case, the content of the reaction retarder (A-5) can be 0 to 8.0 parts by mass based on 100 parts by mass of the total of the components (A-1) and (A-2).

Hereinafter, the components (A-1) to (A-5) will be described.

Component (A-1)

The component (A-1) is an organopolysiloxane having two or more alkenyl groups per molecule; for example, a linear or branched diorganopolysiloxane containing two or more alkenyl groups per molecule, or an organopolysiloxane with a resin structure having a siloxane unit (Q unit) represented by a $SiO_{4/2}$ unit. Particularly, a diorganopolysiloxane containing 0.6 mol % to 9 mol % of alkenyl groups per molecule (mole of alkenyl group/mole of Si), or an organopolysiloxane with the resin structure, is preferable.

Specific examples of such an organopolysiloxane include compounds shown by the following formulae (1), (2), (3). One of these may be used alone, or two or more thereof may be used in mixture.

$$R^7_{(3-a)}X_aSiO-(R^7XSiO)_m-(R^7_2SiO)_n-SiR^7_{(3-a)}X_a \qquad (1)$$

$$R^7_2(HO)SiO-(R^7XSiO)_{p+2}-(R^7_2SiO)_q-SiR^7_2(OH) \qquad (2)$$

$$(SiO_{4/2})_b(R^7_3SiO_{1/2})_c(R^7_{(3-e)}XeSiO_{1/2})_d \qquad (3)$$

(in the formulae, each $R^7$ independently represents a monovalent hydrocarbon group having no aliphatic unsaturated bond; each X independently represents a monovalent organic group containing an alkenyl group; "a" is an integer of 0 to 3; regarding "m" and "n", 2a+m represents such numbers that the content of alkenyl group per molecule is 0.6 mol % to 9 mol %; regarding "p" and "q", p+2 represents such numbers that the content of alkenyl group per molecule is 0.6 mol % to 9 mol %; each "e" is independently an integer of 1 to 3; "b", "c", and "d" are such numbers that (c+d)/b represents 0.3 to 3.0, and that d/(b+c+d) represents 0.01 to 0.6.)

In the formulae, $R^7$ is preferably a monovalent hydrocarbon group having 1 to 10 carbon atoms. Examples thereof include alkyl groups such as a methyl group, an ethyl group, a propyl group, and a butyl group; cycloalkyl groups such as a cyclohexyl group; aryl groups such as a phenyl group and a tolyl group; and the like. Particularly preferable are alkyl groups such as a methyl group or a phenyl group.

As X, the monovalent organic group containing an alkenyl group is preferably an organic group having 2 to 10 carbon atoms. Examples thereof include alkenyl groups such as a vinyl group, an allyl group, a hexenyl group, and an octenyl group; (meth)acryloylalkyl groups such as an acryloylpropyl group, an acryloylmethyl group, and a methacryloylpropyl group; (meth)acryloxyalkyl groups such as an acryloxypropyl group, an acryloxymethyl group, a methacryloxypropyl group, and a methacryloxymethyl group; and alkenyl group-containing monovalent hydrocarbon groups such as a cyclohexenylethyl group and a vinyloxypropyl group. Particularly, a vinyl group is industrially preferable.

In the general formula (1), "a" is an integer of 0 to 3, preferably 1 to 3. This preferable range allows the terminals of the molecular chain to be blocked with alkenyl groups, and thus the reaction can be completed within a short time by the reactive alkenyl groups at the terminals of the molecular chain. Furthermore, a=1 is industrially preferable in terms of cost. The alkenyl group-containing diorganopolysiloxane is preferably in an oil state or crude rubber state. The alkenyl group-containing diorganopolysiloxane may be linear or branched.

The general formula (3) shows an organopolysiloxane with a resin structure having a $SiO_{4/2}$ unit. In the formula, each "e" is independently an integer of 1 to 3; in terms of cost, e=1 is industrially preferable. Moreover, the product of the average value of e and d/(b+c+d) is preferably 0.02 to 1.50, more preferably 0.03 to 1.0. The organopolysiloxane with the resin structure may be dissolved in an organic solvent and used as a solution.

Component (A-2)

The component (A-2) is a crosslinker which is an organohydrogenpolysiloxane having at least two, preferably three or more, silicon atom-bonded hydrogen atoms (Si—H groups) per molecule. The component (A-2) may have a linear, branched, or cyclic structure.

The organohydrogenpolysiloxane as the component (A-2) preferably has a viscosity at 25° C. of 1 to 5,000 mPa·s, further preferably 5 to 500 mPa·s. The organohydrogenpolysiloxane may be a mixture of two or more kinds. The component (A-2) is preferably blended and used in such an amount that the mole ratio of the SiH groups in the component (A-2) to the alkenyl group amount in the component (A-1) (SiH groups/alkenyl groups) ranges from 0.3 to 10, particularly 1.0 to 8.0. When the mole ratio of the SiH groups to the alkenyl groups is 0.3 or more, the crosslinking density is not decreased, and the problem of inability to cure the adhesive layer does not occur, either. When the mole ratio is 10 or less, the crosslinking density is not excessively increased, and sufficient viscosity and tackiness are achieved. In addition, when the mole ratio is 10 or less, the available time of the treatment solution can be prolonged.

Component (A-3)

The component (A-3) is a platinum-based catalyst (i.e., platinum group metal catalyst). Examples thereof include chloroplatinic acid, an alcohol solution of chloroplatinic acid, a reaction product of chloroplatinic acid with alcohol, a reaction product of chloroplatinic acid with an olefin compound, a reaction product of chloroplatinic acid with a vinyl group-containing siloxane, and the like.

The component (A-3) is added in an effective amount. The amount is generally 1 to 5,000 ppm, preferably 5 to 2,000 ppm, in terms of (the mass of) platinum group metal with respect to the total of the components (A-1) and (A-2). When the amount is 1 ppm or more, the curability of the silicone temporary adhesive material composition is not decreased, and the crosslinking density and the holding force are not decreased, either. When the amount is 5,000 ppm or less, the available time of the treatment bath can be prolonged.

Component (A-4)

The component (A-4) is an organic solvent. The polymer layer (A) is formed on the support by a method in which the support is, for example, spin-coated or roll-coated with the composition solution before thermal curing. When the polymer layer (A) is formed on the support by a method such as spin-coating, the support is preferably coated with a solution of the resin. The organic solvent used in this event is not particularly limited, as long as the solvent can dissolve the components (A-1) to (A-3) and (A-5). It is suitable to use a hydrocarbon solvent such as pentane, hexane, cyclohexane, isooctane, nonane, decane, p-menthane, pinene, isododecane or limonene, or a silicone-based solvent. The content of the solvent is 10 to 900 parts by mass, preferably 25 to 400 parts by mass, further preferably 40 to 300 parts by mass, based on 100 parts by mass of the resin.

Component (A-5)

The component (A-5) is a reaction retarder and optionally added when the silicone temporary adhesive material composition is prepared or applied to a base material to prevent the treatment solution from thickening and gelling before thermal curing.

Specific examples thereof include 3-methyl-1-butyn-3-ol, 3-methyl-1-pentyn-3-ol, 3,5-dimethyl-1-hexyn-3-ol, 1-ethynylcyclohexanol, 3-methyl-3-trimethylsiloxy-1-butyne, 3-methyl-3-trimethylsiloxy-1-pentyne, 3,5-dimethyl-3-trimethylsiloxy-1-hexyne, 1-ethynyl-1-trimethylsiloxycyclohexane, bis(2,2-dimethyl-3-butynoxy)dimethylsilane, 1,3,5,7-tetramethyl-1,3,5,7-tetravinylcyclotetrasiloxane, 1,1,3,3-tetramethyl-1,3-divinyldisiloxane, and the like. Preferable are 1-ethynylcyclohexanol and 3-methyl-1-butyn-3-ol.

The component (A-5) is generally blended in an amount ranging from 0 to 8.0 parts by mass, preferably 0.01 to 8.0 parts by mass, particularly preferably 0.05 to 2.0 parts by mass, based on 100 parts by mass of the total of the components (A-1) and (A-2). When the amount is 8.0 parts by mass or less, the curability of the silicone temporary adhesive material composition is not decreased. When the amount is 0.01 parts by mass or more, the reaction control effect is sufficiently exhibited.

Additionally, to this composition solution of the polymer layer (A) before thermal curing, a known antioxidant can be added to enhance the heat resistance.

Moreover, the thermosetting siloxane polymer layer (A) is preferably formed to have a thickness ranging from 10 to 150 μm for use. When the thickness is 10 μm or more, the substrate and the support can be bonded without gaps, and the layer can sufficiently withstand the grinding step for thinning the circuit substrate. The polymer layer (A) preferably has a thickness of 150 μm or less because the resin is prevented from deforming in the heat treatment step such as the step of forming a TSV and can be put to practical use. Note that, to this thermosetting siloxane, 50 parts by mass or less of a filler such as silica may be added so as to further increase the heat resistance.

The cured product of the thermosetting siloxane polymer layer (A) preferably contains 0.001 to 60.000 mol % of a siloxane unit (M unit) represented by $R^1R^2R^3SiO_{1/2}$, 10.000 to 99.999 mol % of a siloxane unit (D unit) represented by $R^4R^5SiO_{2/2}$, 0.000 to 0.005 mol % of a siloxane unit (T unit) represented by $R^6SiO_{3/2}$, and a 0.000 to 60.000 mol % of the siloxane unit (Q unit) represented by $SiO_{4/2}$, and more preferably contains 0.001 to 35.000 mol % of the M unit, 30.000 to 99.999 mol % of the D unit, 0.000 to 0.001 mol % of the T unit, and 0.000 to 50.000 mol % of the Q unit.

In the above description, the organic substituents $R^1$, $R^2$, $R^3$, $R^4$, $R^5$ and $R^6$ are each an unsubstituted or substituted monovalent hydrocarbon group, which preferably has 1 to 10 carbon atoms. Specific examples of the hydrocarbon group include alkyl groups such as a methyl group, an ethyl group, an n-propyl group, an isopropyl group, an n-butyl group, a t-butyl group, an n-pentyl group, a cyclopentyl group, and an n-hexyl group; cycloalkyl groups such as a cyclohexyl group; aryl groups such as a phenyl group and a tolyl group; and groups in which a part or all of hydrogen atoms of the above groups is/are substituted by a halogen atom(s). Particularly preferable are a methyl group and a phenyl group.

Moreover, the cured film of the thermosetting siloxane polymer layer (A) preferably has a storage elastic modulus at 25° C. of $1 \times 10^6$ to $1 \times 10^9$ Pa.

After the thermosetting siloxane polymer layer (A) is cured, the resulting film preferably has such an elastic modulus because the film can sufficiently withstand the grinding step for thinning the circuit substrate, so that the warpage of the substrate is reduced; thus, such problems that the substrate gets caught by an apparatus during the process rarely occur.

—Optional Component—

To the temporary adhesive material used in the present invention, optional components may be added besides the aforementioned components. For example, it is possible to use unreactive polyorganosiloxanes such as polydimethyl siloxane and polydimethyldiphenyl siloxane; antioxidants such as phenol type, quinone type, amine type, phosphorus type, phosphite type, sulfur type, and thioether type; photo stabilizers such as triazole type and benzophenone type; flame retardants such as phosphoric acid ester type, halogen type, phosphorus type, and antimony type; antistatic agents such as a cationic activator, an anionic activator, and a nonionic activator; and solvents for reducing the viscosity during coating, including aromatic solvents such as toluene and xylene, aliphatic solvents such as hexane, octane, and isoparaffin, ketone solvent such as methyl ethyl ketone and methyl isobutyl ketone, ester solvents such as ethyl acetate and isobutyl acetate, ether solvents such as diisopropyl ether and 1,4-dioxane, solvent mixtures thereof, or the like.

The inventive temporary adhesive material layer contains (A-1) to (A-3) described above, and is optionally mixed with (A-4) and/or (A-5) to form an adhesion solution, or formed into a film.

<Method for Processing Circuit Substrate>

A method for processing a circuit substrate of the present invention is a method which uses the inventive circuit substrate processing laminate to process the circuit substrate having a semiconductor circuit and the like. Specifically, the inventive method is characterized in that a monolayer of the temporary adhesive material layer composed of the thermosetting siloxane polymer layer (A) is used as an adhesive layer between the circuit substrate and the support. The thickness of the thinned circuit substrate obtained by the inventive method for processing a circuit substrate is typically 5 to 300 μm, more typically 10 to 100 μm.

The inventive method for processing a circuit substrate includes the steps of:

(a) preparing the inventive circuit substrate processing laminate;

(b) thermally curing the thermosetting siloxane polymer layer (A);

(c) grinding or polishing the back surface of the circuit substrate;

(d) processing the back surface of the circuit substrate;

(e) separating the support from the circuit substrate processing laminate; and (f) taking out only the circuit substrate by separating a cured film of the polymer layer (A) from the circuit substrate processing laminate from which the support has been separated, or (a) preparing the inventive circuit substrate processing laminate;

(b) thermally curing the thermosetting siloxane polymer layer (A);

(c) grinding or polishing the back surface of the circuit substrate;

(d) processing the back surface of the circuit substrate; and (g) taking out only the circuit substrate by separating the support and the polymer layer (A) together from the circuit substrate processing laminate.

[Step (a)]

Step (a) is a step of preparing the inventive circuit substrate processing laminate. In this step, the inventive circuit substrate processing laminate to be prepared is produced by bonding the support and a circuit-forming surface of the circuit substrate with the temporary adhesive material layer interposed therebetween. In this respect, the temporary adhesive material layer is composed of the thermosetting siloxane polymer layer (A), and the circuit substrate has the circuit-forming surface on the front surface and a non-circuit-forming surface on the back surface. The step (a) includes (a-1) a step of laminating an uncured composition layer of the polymer layer (A) onto the support; and (a-2) a step of bonding the support and the circuit substrate with the uncured composition layer of the polymer layer (A) interposed therebetween, or (a-3) a step of laminating an uncured composition layer of the polymer layer (A) onto the circuit substrate; and (a-4) a step of bonding the circuit substrate and the support with the uncured composition layer of the polymer layer (A) interposed therebetween.

When the uncured composition layer of the polymer layer (A) is laminated in the step (a-1) or step (a-3), a film of the uncured composition layer may be formed on the circuit substrate or the support. Alternatively, each solution to give the polymer layer (A) may be used to form the uncured composition layer by a method such as spin-coating, slit-coating, or spray-coating. Preferably, a spin coating method is adopted. In this case, after spin-coating, the layer is pre-baked in advance at a temperature of 80 to 200° C. depending on the volatilization condition of the solvent, and then used.

In the step (a-2) or step (a-4) of bonding the support and the circuit substrate with the polymer layer (A) interposed therebetween, the substrate is uniformly compressed at a temperature within a range of preferably 40 to 200° C., more preferably 60 to 180° C., under reduced pressure (particularly, under vacuum) to form a circuit substrate processing laminate (laminated substrate) in which the circuit substrate and the support are bonded. In this event, Examples of the wafer-bonding apparatus include commercially available wafer-bonding apparatuses, such as EVG520IS and 850 TB manufactured by EV group, XBC300 manufactured by SUSS MicroTec AG, SynapseV manufactured by Tokyo Electron Limited, and the like.

The circuit substrate having a circuit-forming surface and a non-circuit-forming surface is a circuit substrate having the circuit-forming surface on one surface and the non-circuit-forming surface on the other surface. The circuit substrate used in the present invention is generally a semiconductor wafer. Examples of the semiconductor wafer include not only a silicon wafer but also a germanium wafer, a gallium-arsenic wafer, a gallium-phosphorus wafer, a gallium-arsenic-aluminum wafer, and the like. The thickness of the wafer is not particularly limited, but is typically 600 to 800 μm, more typically 625 to 775 μm.

As the support, a substrate such as a silicon wafer, a glass plate, and a quartz wafer can be used without any limitation. In the present invention, it is not necessary to irradiate the temporary adhesive material layer through the support with an energy beam; thus, the support does not require light transmittance.

[Step (b)]

Step (b) is a step of thermally curing the polymer layer (A). After the circuit substrate processing laminate (wafer processing laminate, laminated substrate) is formed, the circuit substrate processing laminate is heated at 120 to 250° C., preferably 140 to 200° C., for 10 minutes to 4 hours, preferably 30 minutes to 2 hours, to cure the polymer layer (A).

[Step (c)]

Step (c) is a step of grinding or polishing the back surface (non-circuit-forming surface) of the circuit substrate bonded to the support, that is, a step of grinding or polishing the circuit substrate processing laminate prepared in the step (a) from the back surface side of the circuit substrate to reduce the thickness of the circuit substrate. The technique for grinding the circuit substrate back surface is not particularly limited, and known grinding techniques may be used. The grinding is preferably performed while water is fed to the circuit substrate and a grinding wheel (such as diamond) for cooling. Examples of the apparatus for grinding the circuit substrate back surface include DAG-810 (product name) manufactured by DISCO Co., Ltd., and the like. In addition, the back surface side of the circuit substrate may be subjected to CMP polishing.

[Step (d)]

Step (d) is a step of processing the circuit substrate processing laminate whose non-circuit-forming surface has been ground, that is, processing the back surface (non-circuit-forming surface) of the circuit substrate processing laminate that has been thinned by the back surface grinding or back surface polishing. This step includes various processes applied in the wafer level. Examples thereof include electrode formation, metal wiring formation, protective film formation, and the like. More specifically, the examples include conventionally known processes such as metal sputtering for forming an electrode or the like, wet etching for etching a metal sputtered layer, patterning process in which a resist is applied and subjected to exposure and development to form a pattern used as a mask for metal wiring formation, resist removal, dry etching, metal plating, silicon etching for forming a TSV, oxide film formation on the silicon surface, and the like. Besides, the thinned wafer by the back surface grinding can also be cut to a chip size by a process such as dicing.

[Step (e)]

Step (e) is a step of separating the support from the circuit substrate processing laminate processed in the step (d), that is, a step of separating the support from the circuit substrate processing laminate after the thinned circuit substrate is subjected to various processes. This separating step is generally carried out under relatively low temperature condition from room temperature to about 60° C. Examples of the separating step include a method in which one of the circuit substrate and the support of the circuit substrate processing laminate is horizontally fixed while the other is lifted at a certain angle with respect to the horizontal direction; a peeling method in which a protective film is bonded to the ground surface of the ground circuit substrate, and then the circuit substrate, the polymer layer (A), and the protective film are separated together from the circuit substrate processing laminate; and the like.

Although any of these separating methods are applicable to the present invention, more suitable is the method in which the circuit substrate of the circuit substrate processing laminate is horizontally fixed while the support is lifted at a certain angle with respect to the horizontal direction. These separating methods are generally carried out at room temperature.

Moreover, the step (e) of separating the support from the circuit substrate processed in the step (d) preferably includes the steps of:

(e-1) bonding a dicing tape to the processed surface of the processed circuit substrate;

(e-2) attaching the dicing tape surface by vacuum suction to a suction surface; and (e-3) separating the support from the processed circuit substrate by peeling-off with the temperature of the suction surface in a temperature range of 10° C. to 100° C. These steps enable the support to be easily separated from the processed circuit substrate, and facilitate a subsequent dicing step.

[Step (f)]

Step (f) is a step of taking out only the circuit substrate by separating a cured film of the polymer layer (A) from the circuit substrate processing laminate from which the support has been separated. The cured film of the polymer layer (A) is preferably separated from the processed circuit substrate by tape peeling after the support is separated in the step (e).

This separating step is generally carried out under relatively low temperature condition from room temperature to about 60° C. The cured film of the polymer layer (A) can be separated from the processed circuit substrate by horizontally fixing the circuit substrate processing laminate, bonding a tape for peeling to the exposed polymer layer (A), and peeling off this tape according to a peeling method. As the tape, any tape can be used as long as it is capable of peeling. Particularly, a tape using silicone adhesive material is preferable. For example, polyester film adhesive tapes No. 646S and No. 648 manufactured by Teraoka Seisakusho Co., Ltd., and the like are preferably used.

[Step (g)]

Step (g) is a step of taking out only the circuit substrate by separating the support and the polymer layer (A) together from the circuit substrate processing laminate processed in the step (d), that is, a step of separating only the thinned circuit substrate from the circuit substrate processing laminate after the thinned circuit substrate is subjected to various processes. This step is generally carried out under relatively low temperature condition from room temperature to about 60° C. Examples of the separating step include a method in which one of the circuit substrate and the support of the circuit substrate processing laminate is horizontally fixed while the other is lifted at a certain angle with respect to the horizontal direction; a peeling method in which a protective film is bonded to the ground surface of the ground circuit substrate, and then the circuit substrate and the protective film are Separated from the circuit substrate processing laminate; and the like.

Although any of these separating methods are applicable to the present invention, more suitable are: the method in which the circuit substrate of the circuit substrate processing laminate is horizontally fixed while the support is lifted at a certain angle with respect to the horizontal direction; and the peeling method in which a protective film is bonded to the ground surface of the ground circuit substrate, and then the circuit substrate and the protective film are separated. These separating methods are generally carried out at room temperature.

Further, the step (g) of taking out only the circuit substrate by separating the support and the polymer layer (A) together from the processed circuit substrate preferably includes the steps of:

(g-1) bonding a dicing tape to the processed surface of the processed circuit substrate;

(g-2) attaching the dicing tape surface by vacuum suction to a suction surface; and (g-3) separating the support from the processed circuit substrate by peeling-off with the temperature of the suction surface in a temperature range of 10° C. to 100° C. These steps enable the support to be easily separated from the processed circuit substrate, and facilitate a subsequent dicing step.

Furthermore, after only the circuit substrate is separated from the processed circuit substrate processing laminate in the step (f) or (g), a step (h) of cleaning the front surface of the circuit substrate can be performed. The cleaning treatment can be carried out by, for example, a wet process using an organic solvent, alkali solution, acid solution, or the like, or a dry process such as dry etching.

In the step (h), for example, hydrocarbon organic solvents are usable. Specific examples thereof include pentane, hexane, cyclohexane, decane, isononane, p-menthane, pinene, isododecane, limonene, and the like. One of these solvents may be used alone, or two or more thereof may be used in combination. If removal is difficult, a base or an acid may be added to the solvent. Examples of the usable base include amines such as ethanolamine, diethanolamine, triethanolamine, triethylamine, and ammonia; and ammonium salts such as tetramethylammonium hydroxide, tetraethylammonium hydroxide, tetrapropylammonium hydroxide, and tetrabutylammonium hydroxide. Examples of the usable acid include organic acids such as acetic acid, oxalic acid, benzenesulfonic acid, and dodecylbenzenesulfonic acid. The amount thereof is 0.01 to 10 mass %, preferably 0.1 to 5 mass %, in terms of concentration in the cleaning solution. To improve the removal efficiency of the residual matters, an existing surfactant may be added. Cleaning may be performed by paddling with the above-mentioned solution, spraying, or dipping in a cleaning solution tank. The temperature is preferably 10 to 80° C., more preferably 15 to 65° C. If necessary, after cleaning with these cleaning solutions, the resultant may be finally rinsed with water or an alcohol, and dried to obtain a thin wafer.

EXAMPLES

Hereinafter, the present invention will be specifically described with reference to Examples and Comparative Examples. However, the present invention is not limited to the following Examples.

Resin Solution Preparation Example 1

To a solution consisting of 200 parts by mass of toluene and 100 parts by mass of polydimethylsiloxane having 2.5 mol % of vinyl groups at molecular side chains and a number average molecular weight (Mn) of 30,000, 40 parts by mass of an organohydrogenpolysiloxane shown by the following formula (M-1) and 0.7 parts by mass of ethynylcyclohexanol were added and mixed. Further, 0.2 parts by mass of a platinum catalyst CAT-PL-5 (manufactured by Shin-Etsu Chemical Co., Ltd.) was added thereto, and the resultant was filtrated through a 0.2-μm membrane filter to thus obtain a thermosetting silicone polymer solution (A1). Note that, in the resin solution, the mole ratio of the organohydrogenpolysiloxane having the Si—H groups to the alkenyl groups in the alkenyl group-containing organopolysiloxane was 1.1.

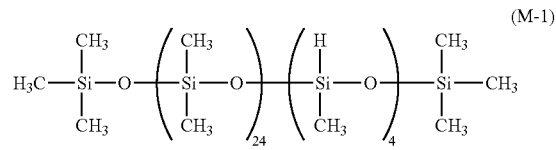

Resin Solution Preparation Example 2

To a solution consisting of 100 parts by mass of toluene and 50 parts by mass of polydimethylsiloxane having 2.5 mol % of vinyl groups at molecular side chains and a number average molecular weight (Mn) of 30,000, a solution consisting of 100 parts by mass of toluene and 50 parts by mass of vinylmethylsiloxane with a resin structure containing 50 mol % of $SiO_{4/2}$ unit (Q unit), 48 mol % of $(CH_3)_3SiO_{1/2}$ unit (M unit) and 2 mol % of $(CH_2=CH)_3SiO_{1/2}$ unit (Vi unit) was added together with 40 parts by mass of the organohydrogenpolysiloxane (M-1) and 0.7 parts by mass of ethynylcyclohexanol, and mixed. Further, 0.2 parts by mass of a platinum catalyst CAT-PL-5 was added thereto, and the resultant was filtrated through a 0.2-μm membrane filter to thus obtain a thermosetting silicone polymer solution (A2). When cured, the thermosetting silicone polymer contains the Q unit which was measured by Si-NMR. Note that, in the resin solution, the mole ratio of the organohydrogenpolysiloxane having the Si—H groups to the alkenyl groups in the alkenyl group-containing organopolysiloxanes was 1.0.

Resin Solution Preparation Example 3

To a solution consisting of 100 parts by mass of toluene and 50 parts by mass of polydimethylsiloxane having 2.5 mol % of vinyl groups at molecular side chains and a number average molecular weight (Mn) of 30,000, a solution consisting of 100 parts by mass of toluene and 50 parts by mass of polydimethylsiloxane having 0.1 mol % of vinyl groups at molecular side chains and a number average molecular weight (Mn) of 100,000 was added together with 20 parts by mass of the organohydrogenpolysiloxane (M-1) and 0.7 parts by mass of ethynylcyclohexanol, and mixed. Further, 0.2 parts by mass of a platinum catalyst CAT-PL-5 was added thereto, and the resultant was filtrated through a 0.2-μm membrane filter to thus obtain a thermosetting silicone polymer solution (A3). Note that, in the resin solution, the mole ratio of the organohydrogenpolysiloxane having the Si—H groups to the alkenyl groups in the alkenyl group-containing organopolysiloxanes was 1.0.

Resin Solution Preparation Example 4

To a solution consisting of 50 parts by mass of toluene and 25 parts by mass of polydimethylsiloxane having 2.5 mol % of vinyl groups at molecular side chains and a number average molecular weight (Mn) of 30,000, a solution consisting of 50 parts by mass of toluene and 25 parts by mass of polydimethylsiloxane having 0.1 mol % of vinyl groups at molecular side chains and a number average molecular weight (Mn) of 100,000, and a solution consisting of 100 parts by mass of toluene and 50 parts by mass of vinylmethylsiloxane with a resin structure containing 50 mol % of $SiO_{4/2}$ unit (Q unit), 48 mol % of $(CH_3)_3SiO_{1/2}$ unit (M unit) and 2 mol % of $(CH_2=CH)_3SiO_{1/2}$ unit (Vi unit) were added together with 35 parts by mass of the organohydrogenpolysiloxane (M-1) and 0.7 parts by mass of ethynylcyclohexanol, and mixed. Further, 0.2 parts by mass of a platinum catalyst CAT-PL-5 was added thereto, and the resultant was filtrated through a 0.2-μm membrane filter to thus obtain a thermosetting silicone polymer solution (A4). When cured, the thermosetting silicone polymer contains the Q unit which was measured by Si-NMR. Note that, in the resin solution, the mole ratio of the organohydrogenpolysiloxane having the Si—H groups to the alkenyl groups in the alkenyl group-containing organopolysiloxanes was 1.1.

Resin Solution Preparation Example 5

To a solution consisting of 50 parts by mass of toluene and 20 parts by mass of polydimethylsiloxane having 0.1 mol % of vinyl groups at molecular side chains and a number average molecular weight (Mn) of 100,000, a solution consisting of 160 parts by mass of toluene and 80 parts by mass of vinylmethylsiloxane with a resin structure containing 50 mol % of $SiO_{4/2}$ unit (Q unit), 48 mol % of $(CH_3)_3SiO_{1/2}$ unit (M unit) and 2 mol % of $(CH_2=CH)_3SiO_{1/2}$ unit (Vi unit) was added together with 35 parts by mass of the organohydrogenpolysiloxane (M-1) and 0.7 parts by mass of ethynylcyclohexanol, and mixed. Further, 0.2 parts by mass of a platinum catalyst CAT-PL-5 was added thereto, and the resultant was filtrated through a 0.2-μm membrane filter to thus obtain a thermosetting silicone polymer solution (A5). Note that, in the resin solution, the mole ratio of the organohydrogenpolysiloxane having the Si—H groups to the alkenyl groups in the alkenyl group-containing organopolysiloxanes was 0.9.

Resin Solution Preparation Example 6

To a solution consisting of 200 parts by mass of toluene and 100 parts by mass of polydimethylsiloxane having 0.1 mol % of vinyl groups at molecular side chains and a number average molecular weight (Mn) of 100,000, 0.5 parts by mass of an organohydrogenpolysiloxane shown by (M-2) and 0.7 parts by mass of ethynylcyclohexanol were added and mixed. Further, 0.5 parts by mass of a platinum catalyst CAT-PL-5 (manufactured by Shin-Etsu Chemical Co., Ltd.) was added thereto, and the resultant was filtrated through a 0.2-μm membrane filter to thus obtain a thermosetting silicone polymer solution (A6). Note that, in the resin solution, the mole ratio of the organohydrogenpolysiloxane having the Si—H groups to the alkenyl groups in the alkenyl group-containing organopolysiloxane was 2.9.

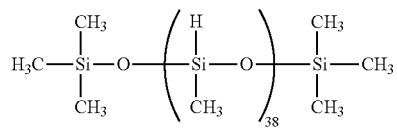

(M-2)

Examples 1 to 5 and Comparative Examples 1, 2

—Peeling Force Test—Support

As a support, a 200-mm silicon wafer (thickness: 725 μm) was spin-coated with one of the above-described solutions (A1) to (A6), and then heated with a hot plate at 50° C. for 3 minutes. Thereby, a layer corresponding to the layer (A) was formed with a thickness shown in Table 1, and placed in an oven under nitrogen atmosphere at 200° C. for 2 hours, so that the polymer layer (A) was cured. Subsequently, five polyimide tapes each having a length of 150 mm and width of 25 mm were bonded onto the polymer layer (A), and a part of the layer (A) to which no tape was bonded was removed. Using AUTOGRAPH (AG-1) manufactured by Shimadzu Co., 120 mm of each tape was peeled off from one end by 180° peeling at a rate of 5 mm/sec, and an average force applied at this time (120 mm stroke, 5 times) was measured as a peeling force of the temporary adhesive layer. Note that the measurement result was recorded as passed if the peeled interface was between the polymer layer (A) and the front surface of the silicon wafer, but recorded as failed and shown with "poor", if the peeled interface was between the bonded side of the tape and the front surface of the polymer layer (A). In the subsequent experiments, when the judgment was made as "poor", the evaluation was stopped.

—Peeling Force Test—Substrate

A 200-mm, copper post-equipped silicon wafer (thickness: 725 μm) whose entire front surface was formed with copper posts each having a height of 10 μm and diameter of 40 μm was spin-coated with one of the solutions (A1) to (A5), and then heated with a hot plate at 50° C. for 3 minutes. Thereby, a layer corresponding to the layer (A) was formed with a thickness shown in Table 1, and placed in an oven under nitrogen atmosphere at 200° C. for 2 hours, so that the polymer layer (A) was cured. Subsequently, five polyimide tapes each having a length of 150 mm and width of 25 mm were bonded onto the polymer layer (A), and a part of the layer (A) to which no tape was bonded was removed. Using AUTOGRAPH (AG-1) manufactured by Shimadzu Co., 120 mm of each tape was peeled off from one end by 180° peeling at a rate of 5 mm/sec, and an average force applied at this time (120 mm stroke, 5 times) was measured as a peeling force of the temporary adhesive layer. Note that the measurement result was recorded as passed if the peeled interface was between the polymer layer (A) and the front surface of the copper post-equipped silicon wafer, but recorded as failed and shown with "poor", if the peeled interface was between the bonded side of the tape and the front surface of the polymer layer (A), or if the peeled interface was changed such that the polymer layer (A) was cut in the middle, for example. In the subsequent experiments, when the judgment was made as "poor", the evaluation was stopped.

—Adhesion Test—

As a support, a 200-mm glass wafer (thickness: 700 μm) was spin-coated with one of the solutions (A1) to (A5), and then heated with a hot plate at 50° C. for 3 minutes. Thereby, a layer corresponding to the layer (A) was formed with a thickness shown in Table 1. To this, a 200-mm diameter silicon wafer (thickness: 725 μm) whose entire front surface was formed with copper posts each having a height of 10 μm and diameter of 40 μm was bonded under vacuum using a wafer-bonding apparatus EVG520IS manufactured by EV group in such a manner that the surface with the copper posts faced the surface with the polymer layer (A). Thus, a circuit substrate processing laminate (laminate) was manufactured. The bonding was carried out with a bonding temperature of 50° C., a chamber internal pressure during the bonding of $10^{-3}$ mbar or less, and a load of 10 kN. After the bonding, the bonded substrate was once heated at 200° C. for 2 hours with an oven to cure the layer (A), and then cooled to room temperature. Thereafter, the adhesion state at the interface was observed by naked eyes. When no abnormality such as bubbles was found at the interface, the specimen was evaluated as favorable and shown with "good". When an abnormality was found, the specimen was evaluated as unfavorable and shown with "poor".

—Back Surface Grinding Resistance Test—

After the adhesion test, the back surface of the silicon wafer of the circuit substrate processing laminate was ground using a grinder (DAG810, manufactured by DISCO Co., Ltd.) with a diamond grinding wheel. After the wafer was ground to a final substrate thickness of 50 μm, abnormalities such as crack and separation were checked under an optical microscope (100-fold). When no abnormality was found, the specimen was evaluated as favorable and shown with "good". When an abnormality was found, the specimen was evaluated as unfavorable and shown with "poor".

—Heat Resistance Test—

After the back surface of the silicon wafer was ground, the circuit substrate processing laminate was heated on a hot plate at 260° C. for 10 minutes. Then, abnormalities in appearance were checked. When no abnormality in appearance was found, the specimen was evaluated as favorable and shown with "good". When slight distortion was observed in the wafer but no abnormality such as void formation, wafer swelling, or wafer breakage was found, the specimen was evaluated as basically favorable and shown with "fair". When an abnormality in appearance such as void, wafer swelling, or wafer breaking was found, the specimen was evaluated as unfavorable and shown with "poor".

—Support Separation Test—

The support separation was evaluated by the following method. First, using a dicing frame, a dicing tape was bonded to the processed surface (non-circuit-forming surface) side of the wafer thinned to 50 μm after the completion of the heat resistance test. This dicing tape surface was set to a suction plate by vacuum suction. Then, one point on the glass was lifted with tweezers at room temperature to separate the glass substrate. When the substrate was successfully separated without cracking the 50-μm wafer, the specimen was shown with "good". When an abnormality such as cracking was found, the specimen was evaluated as unfavorable and shown with "poor".

—Tape Peeling Test—

The tape peeling test was conducted by the following method. First, the dicing tape surface of the wafer having been subjected to the support separation test was continuously set to a suction plate by vacuum suction. Then, a polyester film adhesive tape No. 648 manufactured by Teraoka Seisakusho Co., Ltd. was bonded to the cured film of the polymer layer (A) exposed from the front surface. The tape was peeled to separate the cured film of the polymer layer (A) from the wafer. When the layer was successfully separated without cracking the 50 μm-wafer, the specimen was shown with "good". When an abnormality such as cracking was found, the specimen was evaluated as unfavorable and shown with "poor".

TABLE 1

| | | Example 1 | Example 2 | Example 3 | Example 4 | Example 5 | Comparative Example 1 | Comparative Example 2 |
|---|---|---|---|---|---|---|---|---|
| Manufacturing condition | Resin layer solution | A1 | A2 | A3 | A4 | A1 | A5 | A6 |
| | M unit | 0.5 mol % | 19 mol % | 1.4 mol % | 11 mol % | 0.5 mol % | 31 mol % | 0.2 mol % |
| | D unit | 99.5 mol % | 62 mol % | 98.6 mol % | 80 mol % | 99.5 mol % | 39 mol % | 99.8 mol % |
| | Q unit | 0 mol % | 18 mol % | 0 mol % | 9 mol % | 0 mol % | 30 mol % | 0 mol % |
| | Thickness of layer (A) | 35 μm | 35 μm | 35 μm | 35 μm | 50 μm | 35 μm | 35 μm |
| Results | Support peeling force | 100 mN | 200 mN | 150 mN | 400 mN | 100 mN | 1200 mN | poor |
| | Substrate peeling force | 220 mN | 450 mN | 350 mN | 900 mN | 220 mN | 2500 mN | poor |
| | Adhesion | good | good | good | good | good | good | — |
| | Back surface grinding resistance | good | good | good | good | good | good | — |
| | Heat resistance | good | good | good | good | good | good | — |
| | Support separation | good | good | good | good | good | poor | — |
| | Tape peeling | good | good | good | good | good | — | — |

As shown in Table 1, it can be seen that Examples 1 to 5 which satisfy the requirements of the present invention facilitated temporary adhesion and separation. On the other hand, Comparative Example 1, in which the peeling force of the layer (A) was too strong, failed to separate the support. Moreover, Comparative Example 2, in which the peeling force was further stronger than that in Comparative Example 1, was not measured from the peeling force measurement.

These revealed that making the peeling force at an appropriate value guaranteed the processability.

It should be noted that the present invention is not limited to the above-described embodiments. The embodiments are described for illustrative purposes, and those having substantially the same configuration and those providing the same operational advantage as the technical concept described in the claims of the present invention are all encompassed in the technical scope of the present invention.

The invention claimed is:

1. A circuit substrate processing laminate comprising, sequentially in the order of
a support,
a temporary adhesive material layer having a monolayer structure, and
a circuit substrate, which is directly provided on the temporary adhesive material layer,
wherein
the temporary adhesive material layer is directly provided on the support and directly contacts the circuit substrate,
the temporary adhesive material layer is releasably laminated on the support,
the circuit substrate has a front surface on which a circuit is formed and a back surface to be processed, and
the temporary adhesive material layer is releasably laminated to the front surface of the circuit substrate,
the temporary adhesive material layer is composed of a thermosetting siloxane polymer layer (A),
the polymer layer (A) laminated on the support, after cured, has a first peeling force of 10 to 500 mN/25 mm as measured by a 180° peel test conducted at 5 mm/second using a test piece having a width of 25 mm, where the first peeling force is required for peeling the polymer layer (A) from an interface with the support, and
the polymer layer (A) laminated on the circuit substrate, after cured, has a second peeling force of 50 to 1000 mN/25 mm as measured by the 180° peel test conducted at 5 mm/second using a test piece having a width of 25 mm, where the second peeling force is required for peeling the polymer layer (A) from an interface with the circuit substrate.

2. The circuit substrate processing laminate according to claim 1, wherein the thermosetting siloxane polymer layer (A) is a cured product of a composition containing:
(A-1) an organopolysiloxane having two or more alkenyl groups per molecule;
(A-2) an organohydrogenpolysiloxane having two or more silicon atom-bonded hydrogen atoms (Si—H groups) per molecule; and
(A-3) a platinum-based catalyst, in such an amount that a mole ratio of the Si—H groups in the component (A-2) to the alkenyl groups in the component (A-1) is 0.3 to 10.

3. The circuit substrate processing laminate according to claim 2, wherein the organopolysiloxane (A-1) having two or more alkenyl groups per molecule contains a siloxane unit (Q unit) represented by $SiO_{4/2}$.

4. The circuit substrate processing laminate according to claim 2, wherein the thermosetting siloxane polymer layer (A) is a cured product of a composition containing the component (A-1), the component (A-2), the component (A-3), and further either or both of (A-4) an organic solvent and (A-5) a reaction retarder.

5. The circuit substrate processing laminate according to claim 3, wherein the thermosetting siloxane polymer layer (A) is a cured product of a composition containing the component (A-1), the component (A-2), the component (A-3), and further either or both of (A-4) an organic solvent and (A-5) a reaction retarder.

6. The circuit substrate processing laminate according to claim 1, wherein the cured product of the thermosetting siloxane polymer layer (A) contains
0.001 to 60.000 mol % of a siloxane unit (M unit) represented by $R^1R^2R^3SiO_{1/2}$,
10.000 to 99.999 mol % of a siloxane unit (D unit) represented by $R^4R^5SiO_{2/2}$,
0.000 to 0.005 mol % of a siloxane unit (T unit) represented by $R^6SiO_{3/2}$, and
0.000 to 60.000 mol % of a siloxane unit (Q unit) represented by $SiO_{4/2}$,
where $R^1$ to $R^6$ each represent an unsubstituted or substituted monovalent hydrocarbon group.

7. The circuit substrate processing laminate according to claim 2, wherein the cured product of the thermosetting siloxane polymer layer (A) contains
0.001 to 60.000 mol % of a siloxane unit (M unit) represented by $R^1R^2R^3SiO_{1/2}$,
10.000 to 99.999 mol % of a siloxane unit (D unit) represented by $R^4R^5SiO_{2/2}$,
0.000 to 0.005 mol % of a siloxane unit (T unit) represented by $R^6SiO_{3/2}$, and
0.000 to 60.000 mol % of a siloxane unit (Q unit) represented by $SiO_{4/2}$,
where $R^1$ to $R^6$ each represent an unsubstituted or substituted monovalent hydrocarbon group.

8. The circuit substrate processing laminate according to claim 1, wherein the cured product of the thermosetting siloxane polymer layer (A) has a storage elastic modulus at 25° C. of $1\times10^6$ to $1\times10^9$ Pa.

9. The circuit substrate processing laminate according to claim 2, wherein the cured product of the thermosetting siloxane polymer layer (A) has a storage elastic modulus at 25° C. of $1\times10^6$ to $1\times10^9$ Pa.

10. The circuit substrate processing laminate according to claim 1, wherein the circuit substrate processing laminate consists of the support, the temporary adhesive material layer having the monolayer structure, and the circuit substrate.

11. A method for processing a circuit substrate, comprising the steps of:
(a) preparing the circuit substrate processing laminate according to claim 1;
(b) thermally curing the thermosetting siloxane polymer layer (A);
(c) grinding or polishing the back surface of the circuit substrate;
(d) processing the back surface of the circuit substrate;
(e) separating the support from the circuit substrate processing laminate; and
(f) taking out only the circuit substrate by separating a cured film of the polymer layer (A) from the circuit substrate processing laminate from which the support has been separated.

12. The method for processing a circuit substrate according to claim 11, wherein the step (a) of preparing the circuit substrate processing laminate includes:
(a-3) a step of laminating an uncured composition layer of the polymer layer (A) onto the circuit substrate; and
(a-4) a step of bonding the circuit substrate and the support with the uncured composition layer of the polymer layer (A) interposed therebetween.

13. A method for processing a circuit substrate, comprising the steps of:

(a) preparing the circuit substrate processing laminate according to claim 1;
(b) thermally curing the thermosetting siloxane polymer layer (A);
(c) grinding or polishing the back surface of the circuit substrate;
(d) processing the back surface of the circuit substrate; and
(g) taking out only the circuit substrate by separating the support and the polymer layer (A) together from the circuit substrate processing laminate.

14. The method for processing a circuit substrate according to claim 11, wherein the step (a) of preparing the circuit substrate processing laminate includes:
(a-1) a step of laminating an uncured composition layer of the thermosetting siloxane polymer layer (A) onto the support; and
(a-2) a step of bonding the support and the circuit substrate with the uncured composition layer of the polymer layer (A) interposed therebetween.

15. The method for processing a circuit substrate according to claim 13, wherein the step (a) of preparing the circuit substrate processing laminate includes:
(a-1) a step of laminating an uncured composition layer of the thermosetting siloxane polymer layer (A) onto the support; and
(a-2) a step of bonding the support and the circuit substrate with the uncured composition layer of the polymer layer (A) interposed therebetween.

16. The method for processing a circuit substrate according to claim 13, wherein the step (a) of preparing the circuit substrate processing laminate includes:
(a-3) a step of laminating an uncured composition layer of the polymer layer (A) onto the circuit substrate; and
(a-4) a step of bonding the circuit substrate and the support with the uncured composition layer of the polymer layer (A) interposed therebetween.

* * * * *